United States Patent
Komiya et al.

(10) Patent No.: US 6,456,013 B1
(45) Date of Patent: Sep. 24, 2002

(54) THIN FILM TRANSISTOR AND DISPLAY DEVICE

(75) Inventors: Naoaki Komiya, Ogaki; Keiichi Sano, Gifu, both of (JP)

(73) Assignee: Sanyo Electric Co., Ltd. (JP)

(*) Notice: Subject to any disclaimer, the term of this patent is extended or adjusted under 35 U.S.C. 154(b) by 0 days.

(21) Appl. No.: 09/671,844

(22) Filed: Sep. 27, 2000

(30) Foreign Application Priority Data

Sep. 30, 1999 (JP) .......................................... 11-279874

(51) Int. Cl.[7] ................................................. G09G 3/10
(52) U.S. Cl. ........................ 315/169.1; 313/498; 345/92
(58) Field of Search ........................... 315/169.3, 169.1; 313/498, 506; 345/76, 77, 80, 92; 257/59, 72; 438/149, 157

(56) References Cited

U.S. PATENT DOCUMENTS

| | | | |
|---|---|---|---|
| 4,466,179 A | 8/1984 | Kasten | 29/576 T |
| 4,528,480 A | 7/1985 | Unagami et al. | 315/169.1 |
| 5,589,406 A | 12/1996 | Kato et al. | 437/21 |
| 5,616,506 A | 4/1997 | Takemura | 438/150 |
| 5,712,191 A | 1/1998 | Nakajima et al. | 437/174 |
| 5,789,763 A | 8/1998 | Kato et al. | 257/72 |
| 5,808,318 A | 9/1998 | Masumo et al. | 257/66 |
| 5,808,595 A | 9/1998 | Kubota et al. | 345/92 |
| 5,824,574 A | 10/1998 | Yamazaki et al. | 438/150 |
| 5,942,856 A | 8/1999 | Koyama | 315/169.3 |
| 5,943,593 A | 8/1999 | Noguchi et al. | 438/487 |
| 5,953,597 A | 9/1999 | Kusumoto et al. | 438/161 |
| 5,981,974 A | 11/1999 | Makita | 257/72 |
| 6,028,577 A | 2/2000 | Sakamoto | 345/92 |
| 6,037,924 A | 3/2000 | Koyama et al. | 345/92 |
| 6,057,183 A | 5/2000 | Koyama et al. | 438/166 |
| 6,096,581 A | 8/2000 | Zhang et al. | 438/149 |
| 6,160,272 A * | 12/2000 | Arai et al. | 257/72 |
| 6,252,248 B1 * | 6/2001 | Sano et al. | 257/59 |

FOREIGN PATENT DOCUMENTS

JP 06137418 1/1996

\* cited by examiner

*Primary Examiner*—Don Wong
*Assistant Examiner*—Thuy Vinh Tran
(74) *Attorney, Agent, or Firm*—Cantor Colburn LLP (57) ABSTRACT

The extending direction of a gate electrode configured by protruding a portion of a gate signal line is tilted with respect to the extending direction of the gate signal line. To form the active layer of a switching TFT, a focused laser is irradiated on an a-Si film to form a p-Si film. During this process, the long-axis direction of the laser is oriented either orthogonally or in parallel with respect to the extending direction of the gate signal line. Accordingly, by tilting the extending direction of the gate electrode with respect to the extending direction of the gate signal line, a junction portion between a channel and a source/drain is prevented from entirely overlapping a periphery portion of the laser along its long-axis direction. This arrangement prevents generation of leak current in the switching TFT, realizing a stable EL display device.

20 Claims, 6 Drawing Sheets

THIN FILM TRANSISTOR AND DISPLAY DEVICE

BACKGROUND OF THE INVENTION

1. Field of the Invention

The present invention relates to a thin film transistor and a display device, and particularly to an electroluminescence display device using an electroluminescence element and a thin film transistor.

2. Description of the Related Art

In recent years, display devices using electroluminescence (hereinafter referred to as "EL") elements have gained attention as display devices that may replace CRTs and LCDs. Progress is being made in research and development of a display device using thin film transistors (hereinafter referred to as "TFTs") as switching elements for driving the EL elements.

Figure 1:
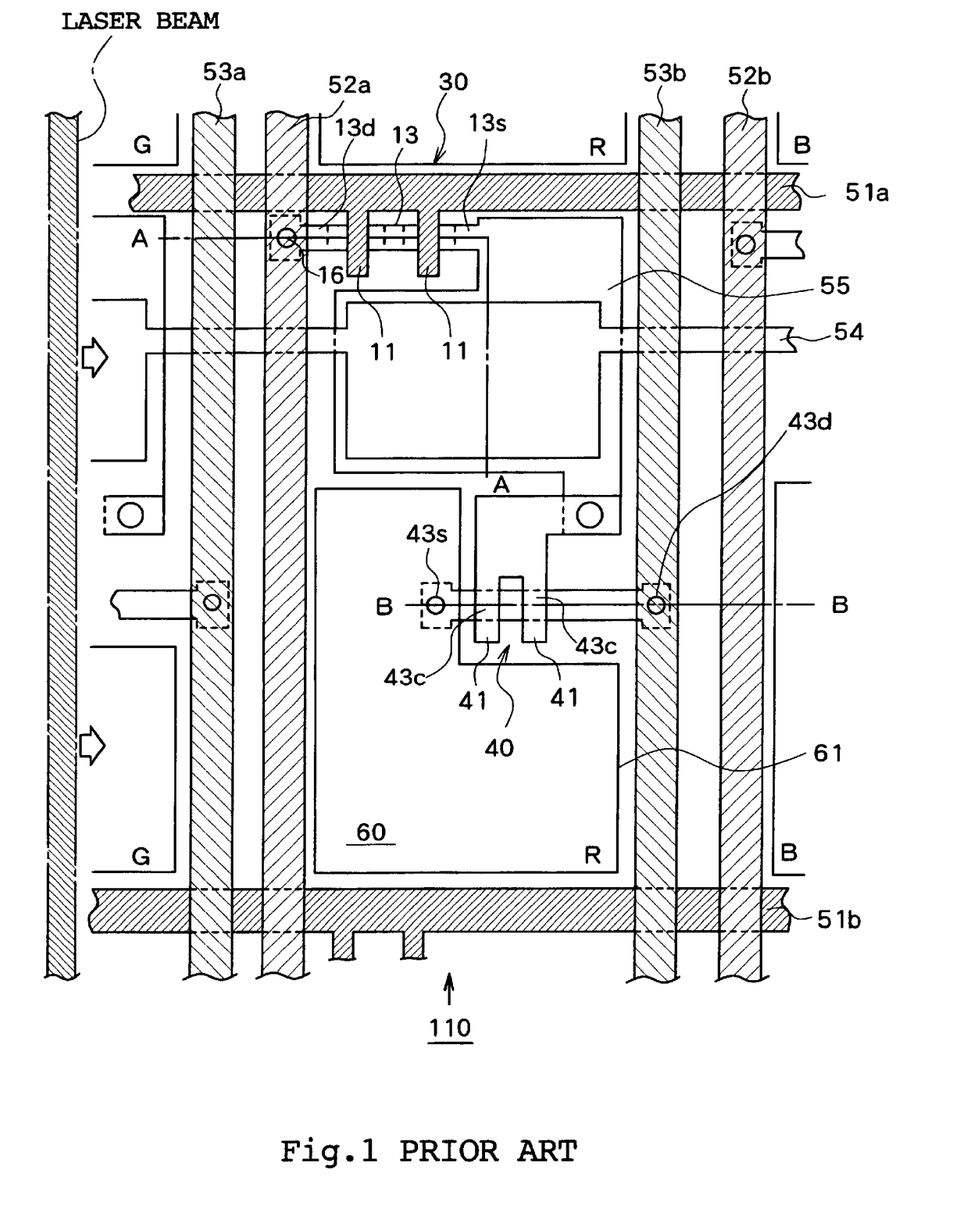
FIG. 1 is a plan view of a conventional EL display device.
Figure 2A:
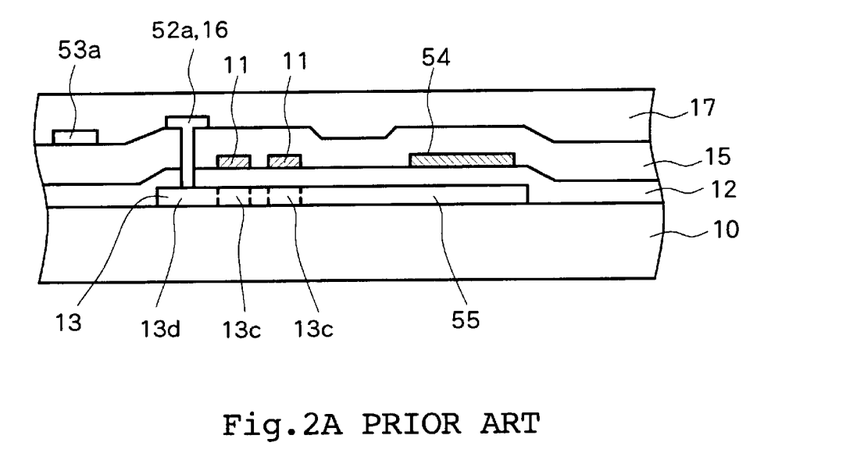
FIGS. 2A and 2B are cross-sectional views of the conventional EL display device shown in FIG. 1.
Figure 2B:
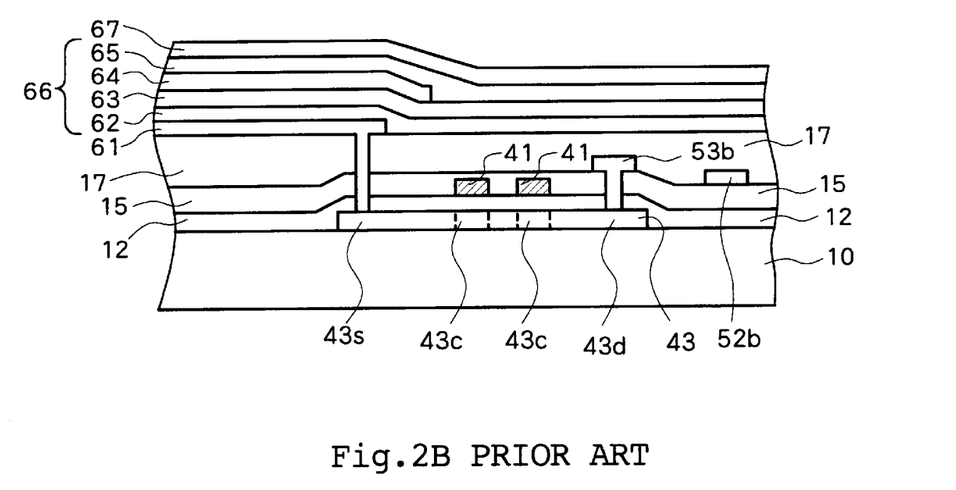
Figure 5A:
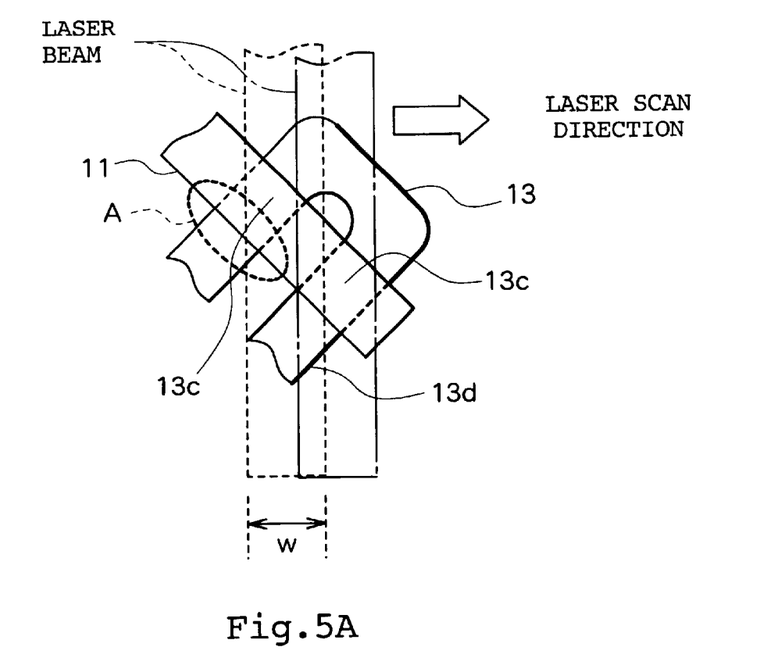
FIGS. 5A and 5B are enlarged partial views of TFTs illustrating the relationship between a junction portion between a channel and a source/drain of a TFT, and the edge direction of an irradiated laser.
Figure 5B:
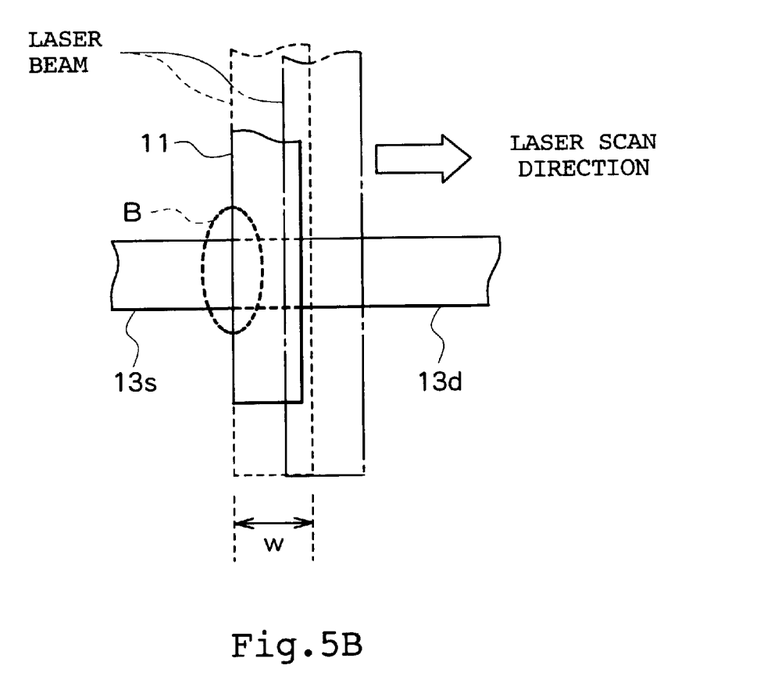
Figure 6:
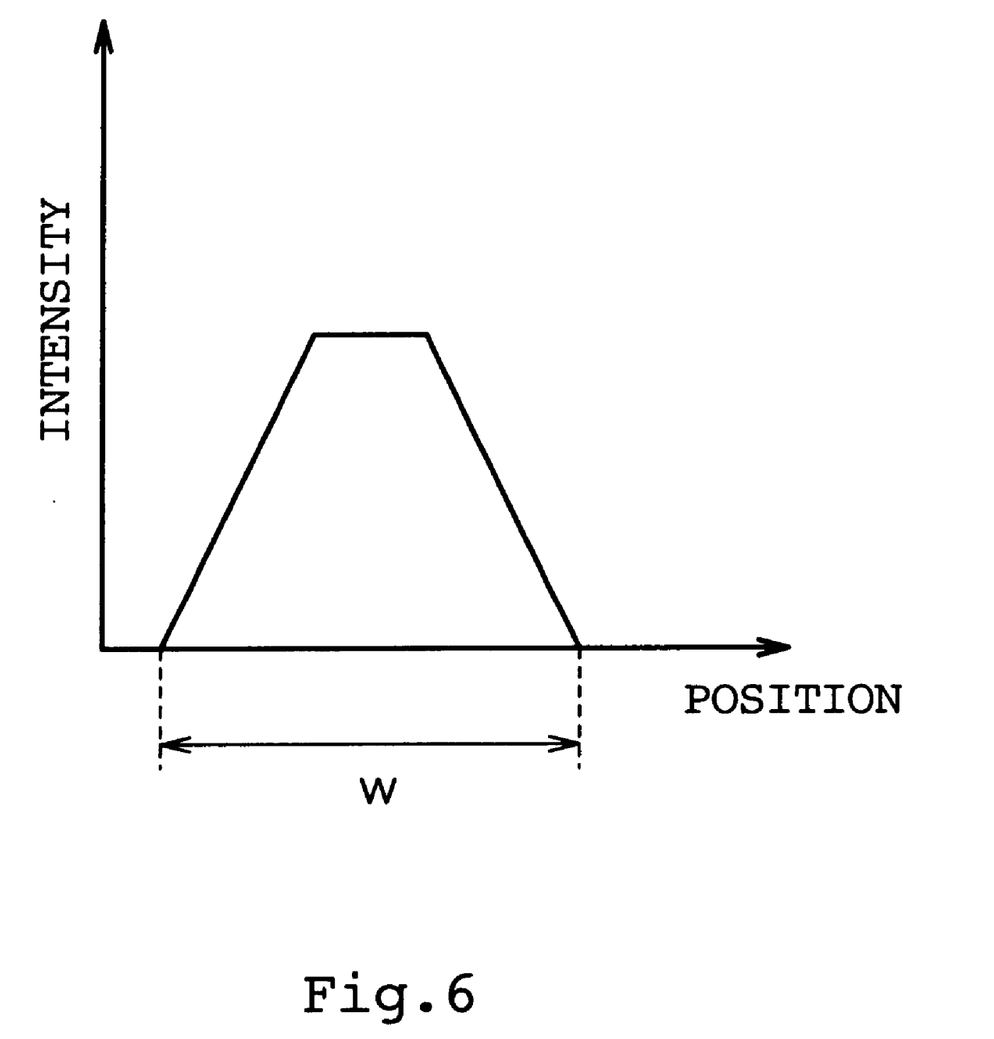
FIG. 6 is a diagram showing the energy distribution in the short-axis direction of a laser.

FIG. 1 is a plan view showing an area around a display pixel in a conventional EL display device. FIG. 2A shows a cross-sectional view taken along line A—A of FIG. 1, while FIG. 2B shows a cross-sectional view taken along line B—B of FIG. 1. FIG. 5B illustrates a state in which a laser is irradiated on a conventional TFT. FIG. 6 shows the energy distribution in the short-axis direction of a linear shape laser.

As shown in FIG. 1, formed overlapping one another are a plurality of gate signal lines 51a, 51b extending in the row direction (horizontal direction in the figure), and a plurality of data signal lines 52a, 52b and power source lines 53a, 53b extending in the column direction (vertical direction in the figure). An area surrounded by the two types of signal lines (51a, 51b, 52a, 52b) constitutes one display pixel region 110. Arranged in each display pixel region 110 are an EL display element 60, switching TFT 30, storage capacitor, and EL element driving TFT 40.

A display pixel region 110 formed at the intersecting portion between the gate signal line 51a and the data signal line 52a is referred to as an example in the following description. The EL display element 60, switching TFT 30, storage capacitor, and EL element driving TFT 40 of the display pixel region 110 are described according to FIGS. 1, 2A, and 2B.

The switching TFT 30 includes gate electrodes 11 connected to the gate signal line 51a and supplied with a gate signal, a drain electrode 16 connected to the data signal line (drive signal line) 52a and supplied with a data signal (drive signal), and a source electrode 13s connected to a gate electrode 41 of the EL element driving TFT 40. The TFT 30 is formed by disposing on an insulating substrate 10 a polysilicon film (hereinafter referred to as "p-Si film") 13 serving as an active layer, and then sequentially forming a gate insulating film 12 and gate electrodes 11. The gate electrodes are shaped as two perpendicular protrusions from the gate signal line 51a, constituting a what is known as a double gate structure.

A storage capacitor electrode line 54 is disposed in parallel to the gate signal line 51a. Charges are stored between the storage capacitor electrode line 54 and a capacitor electrode 55 formed in an underlying layer beneath the gate insulating film 12, thereby creating a capacitor. The capacitor electrode 55 is formed by extending a portion of the source 13s, and is provided for retaining a voltage applied to the gate electrode 41 of the EL element driving TFT 40.

The EL element driving TFT 40 includes a gate electrodes 41 connected to the source electrode 13s of the switching TFT 30, a source electrode 43s connected to the anode 61 of the EL element 60, and a drain electrode 43d connected to the power source line 53b supplying power to the EL element 60.

The EL element 60 comprises an anode 61 connected to the source electrode 43s, a cathode which is a common electrode, and an emissive element layer 66 disposed between the anode 61 and the cathode 67.

When a gate signal from the gate signal line 51a is applied to the gate electrodes 11, the switching TFT 30 is turned on. In response, a data signal is supplied from the data signal line 52a to the gate electrode 41 of the EL element driving TFT 40. The potential of the gate electrode 41 thereby becomes equal to the potential of the data signal line 52a. As a result, a current corresponding to the value of the voltage supplied to the gate electrode 41 is supplied to the EL element 60 from the power source line 53b connected to a power source, causing light emission from the EL element 60.

The EL element 60 is formed by first providing the anode 61, which is made of a transparent electrode composed of a material such as ITO (indium tin oxide). The emissive element layer 66 is then superimposed. The emissive element layer 66 comprises a first hole-transport layer 62 composed of MTDATA (4,4',4"-tris(3-methylphenylphenylamino)triphenylamine), a second hole-transport layer 63 composed of TPD (N,N'-diphenyl-N,N'-di(3-methylphenyl)-1,1'-biphenyl-4,4'-diamine), an emissive layer 64 composed of Bebq$_2$ (bis(10-hydroxybenzo[h]quinolinato)beryllium) including quinacridone derivatives, and an electron transport layer 65 composed of Bebq$_2$. Subsequently, the cathode 67 is formed by laminating lithium fluoride (LiF) and aluminum (Al), or by using a magnesium-indium alloy. These layers constituting the EL element 60 are laminated in the described order.

In the EL element, holes injected from the anode and electrons injected from the cathode recombine in the emissive layer. As a result, organic molecules constituting the emissive layer are excited, generating excitons. Through the process in which these excitons undergo radiation until deactivation, light is emitted from the emissive layer. This light radiates outward through the transparent anode via the transparent insulating substrate, finally resulting in light emission.

A p-Si film is employed as the active layer in the TFTs 30, 40. The p-Si film is formed by depositing an amorphous silicon film (hereinafter referred to as "a-Si film") on the substrate 10 by CVD or other methods, and polycrystallizing the a-Si film by irradiating a linear shape laser. Subsequently, the gate electrodes 11 are disposed thereon after the gate insulating film 12 is deposited.

Laser irradiation is performed, as shown in FIG. 5B, by repeating spot irradiation of a linear shape laser from one end of the substrate to the other, so as to scan the substrate. In the figure, after irradiating a laser in the area indicated by a dotted line, the laser is shifted towards the right by a predetermined distance to irradiate the next spot indicated by one dot chain line. This irradiation process is continually repeated from one end of the substrate to the other. The laser irradiation is performed by orienting the long-axis direction of the laser orthogonally to the gate signal line as shown in FIG. 1.

As shown in FIG. 6, the energy distribution of the linear shape laser in its short-axis direction is gradually reduced towards both peripheral portions compared to the center portion. In other words, the intensity of the laser light is not uniform. There may be cases when, as shown in FIG. 5B, a periphery portion of the footprint of the low energy laser overlaps a junction portion (indicated by dotted circle B in the figure) between the channel 13c and the source 13s, the portion in which the active layer is overlapped by the subsequently formed gate 11. In such cases, as crystallization cannot be fully performed in that region of p-si film, the grain size in that region will be smaller than in regions irradiated with higher laser energy. While theoretically it is possible to irradiate the region irradiated with a low energy laser a second time with a laser having a high energy so as to increase the grain sizes, such a process is not practical because the resulting grain sizes are not identical to those of other regions. A TFT characteristic obtained by irradiating laser only once on an a-Si film differs from a TFT characteristic obtained by irradiating laser for a second time on an a-Si film previously irradiated with laser, with the TFT characteristic achieved by polycrystallizing a film in an amorphous state through one laser irradiation process being the more preferable. This preference is especially notable concerning the characteristic of a junction portion between a channel and a source/drain. Specifically, when a channel junction portion corresponds to the region in which the first laser irradiation is not made with sufficient energy, characteristic degradation in the TFT active layer is severe such that electric field concentration caused by a voltage applied to the gate electrode generates a leak current.

In a conventional EL display device, such as that shown in FIGS. 1 and 5B, the gate electrodes of the switching TFT 30 are shaped perpendicularly protruding from the extending direction of the gate signal line. Accordingly; the gate electrodes orthogonally overlaps the p-Si film constituting the active layer, which is patterned underneath the gate electrodes.

With this arrangement, when irradiating laser light on an a-Si film to form p-Si film through polycrystallization, it is inevitable that a channel junction portion is overlapped by a low energy periphery portion of the linear shape laser. When such an irradiation is performed, leak current may be generated in the TFT as described above.

Generation of an off-leak current causes a fluctuation of voltage to be applied to the gate of the EL element driving TFT 40 even when the switching TFT 30 is turned off, thereby turning on the EL element driving TFT 40. As a result, the EL element 60 constantly emits light, making it impossible to favorably display a desired image.

Furthermore, the data signal lines and the power source lines must be designed so as not to overlap one another because these lines are formed using the same low-resistance material to reduce manufacturing processes. With this limitation, when the gate electrodes are orthogonally arranged with respect to the gate signal lines, and the active layer is orthogonally arranged with respect to the gate electrodes, the area size of the entire display pixel becomes large, making it impossible to arrange wiring and display pixels with a high density.

SUMMARY OF THE INVENTION

The present invention was conceived to solve the above problems. An object of the present invention is to provide a display device in which leak current is suppressed in a switching TFT to maintain the potential of the gate electrode of an element driving TFT at a predetermined level, thereby allowing an EL element to emit light at a desired luminance. A further object of the present invention is to provide a display device in which the display pixels are densely arranged.

In a TFT of the present invention, the main extending direction of a gate electrode configured by protruding from a gate signal line is tilted with respect to the extending direction of the gate signal line.

In another aspect of the TFT according to the present invention, the semiconductor film constituting the active layer intersects the gate electrode a plurality of times.

A display device of the present invention comprises a self-emissive element, a switching thin film transistor (TFT) for controlling a timing for supplying a current to the self-emissive element, and a gate signal line for supplying a gate signal to the switching TFT, wherein the main extending direction towards which a gate electrode protrudes from the gate signal line is tilted with respect to the extending direction of the gate signal line.

In another aspect of the display device according to the present invention, an element driving TFT for supplying power to the self-emissive element is provided in a display pixel.

In a further aspect of the display device according to the present invention, a data signal line for supplying a data signal to the switching TFT and a power source line for supplying power to the self-emissive element in accordance with the data signal are arranged intersecting the gate signal line in an area between display pixels.

In a still further aspect of the display device according to the present invention, a plurality of display pixels are arranged in a row direction in a plurality of rows, and respective pixels in adjacent rows are shifted away from one another by a predetermined number of pixels. In this display device, the data signal line and/or the power source line is meandered in accordance with the shift. The meandering direction and the main extending direction of the gate electrode substantially match.

According to another aspect according to the present invention, the display device further includes a storage capacitor between the switching TFT and the element driving TFT, for retaining a signal supplied from the switching TFT and supplying the signal to the element driving TFT.

In a still further aspect of the display device according to the present invention, respective regions constituting the switching TFT, the storage capacitor, the element driving TFT, and the self-emissive element are arranged in each display pixel sequentially from a side of the display pixel adjacent to the gate signal line to which the display pixel is connected.

According to a still further aspect of the display device according to the present invention, the channel length direction of the switching TFT is tilted relative to the extending direction of the gate signal line.

In another aspect of the present invention, the channel length direction of the element driving TFT is substantially orthogonal relative to the data signal line and/or the power source line.

According to a further aspect of the present invention, the semiconductor film constituting the active layer of the switching TFT intersects the gate electrode for a plurality of times.

According to a still further aspect of the present invention, the data signal line and the power source line do not intersect one another within a display region of the display device.

According to another aspect of the present invention, the self-emissive element is an electroluminescence element or, alternatively, an organic electroluminescence element.

In a further aspect of the present invention, the extending direction of the gate signal line is parallel to an extending direction of any of the edges of a substrate on which the display device is formed.

According to the present invention, there is provided a display device in which leak current is suppressed in the switching TFT to maintain the potential of the gate electrode of the element driving TFT at a fixed level, thereby allowing the EL element to emit light at a desired luminance, and in which the display pixels and wiring can be arranged at a high density.

DESCRIPTION OF THE PREFERRED EMBODIMENT

A preferred embodiment of the present invention is described below referring to an example in which the present invention is implemented in an EL display device.

Figure 3:
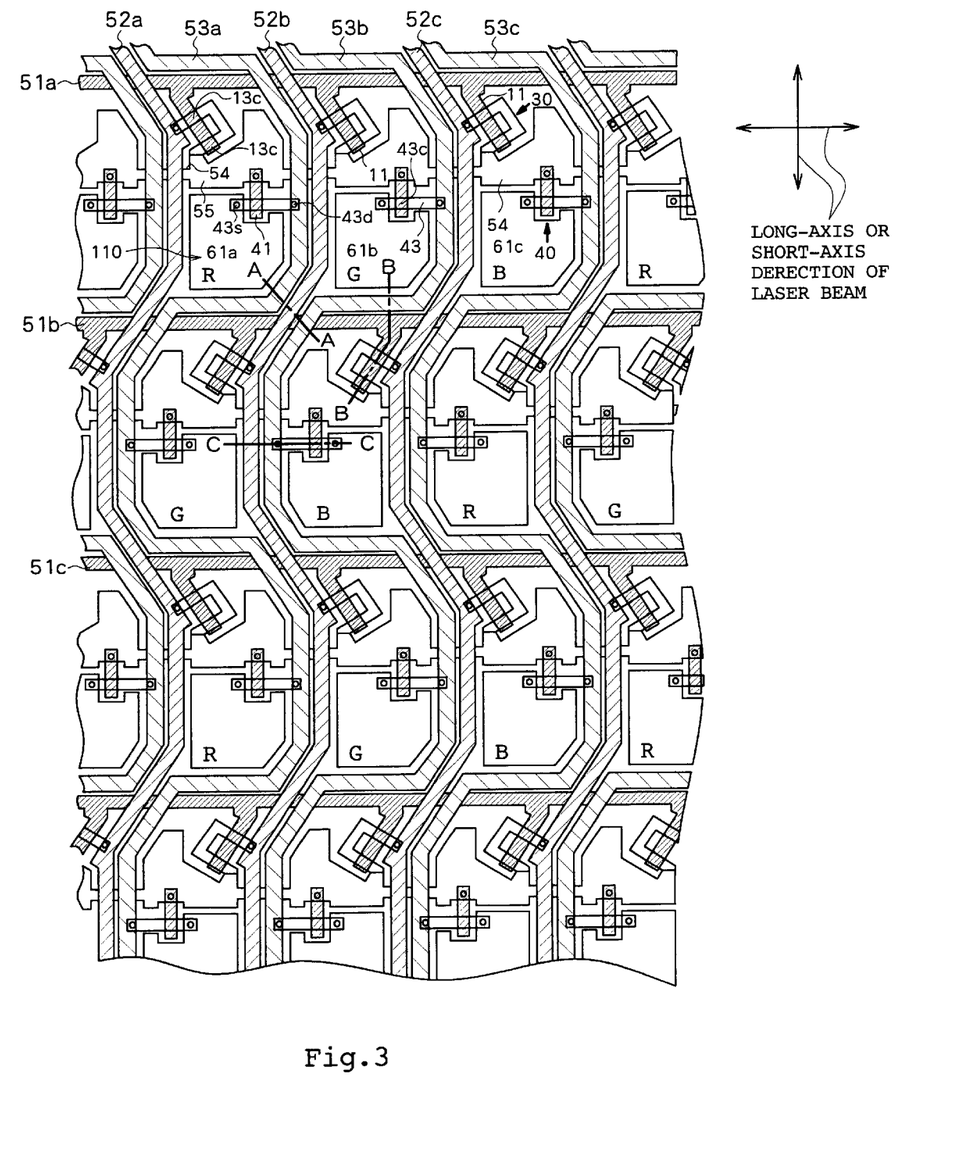
FIG. 3 is a plan view of an EL display device according to the present invention.
Figure 4A:
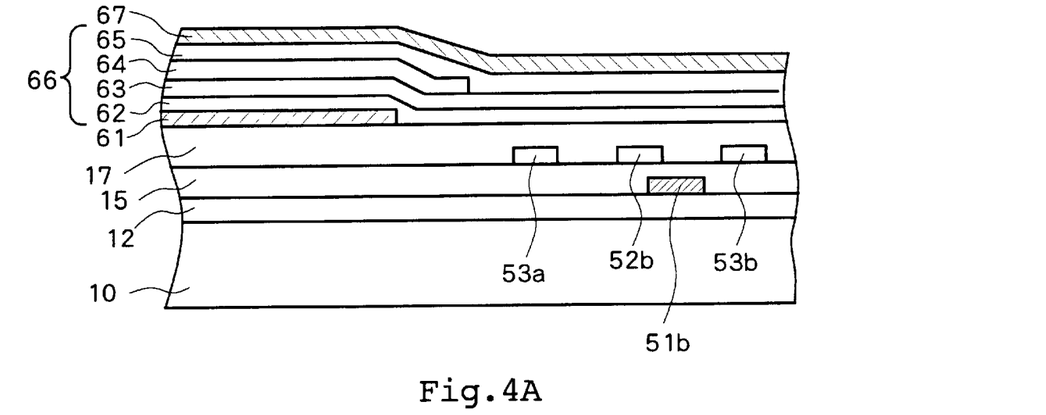
FIGS. 4A, 4B, and 4C are cross-sectional views of the EL display device of the present invention shown in FIG. 3.
Figure 4B:
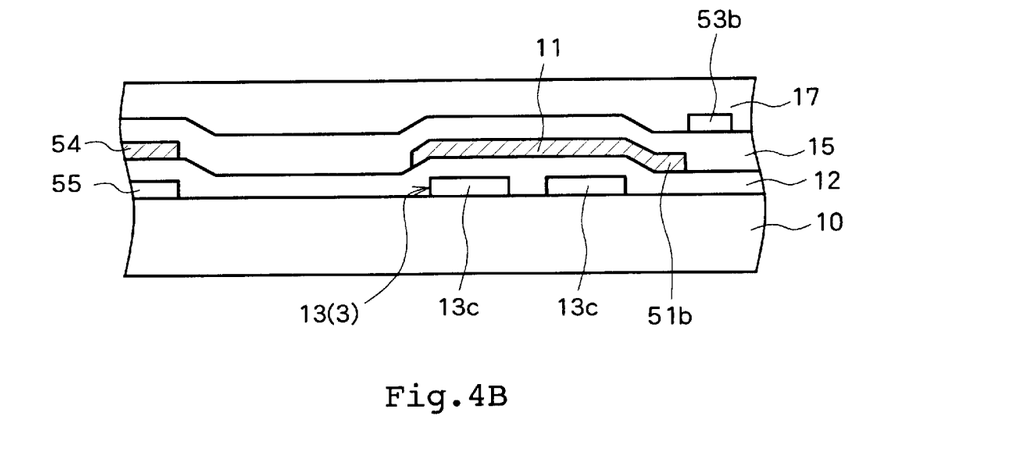
Figure 4C:
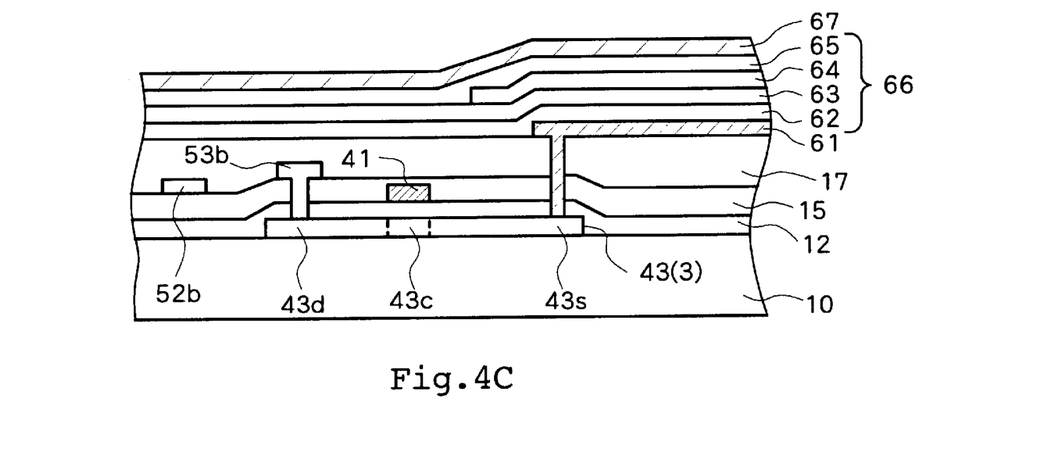

FIG. 3 is a plan view showing a display pixel region in the organic EL display device. FIG. 4A is a cross-sectional view taken along line A—A of FIG. 3, FIG. 4B is a cross-sectional view taken along line B—B of FIG. 3, and FIG. 4C is a cross-sectional view taken along line C—C of FIG. 3. Further, FIG. 5A illustrates the state in which laser is irradiated on a TFT of the present invention.

In the present embodiment, each TFT 30, 40 provided in the EL display device has a top gate type structure wherein a gate electrode is disposed above the active layer, with a gate insulating film disposed therebetween. A p-Si film polycrystallized by irradiating a laser on an a-Si film is used as the active layer.

As shown in FIG. 3, a plurality of gate signal lines 51a, 51b, 51c are extended in the row direction (horizontal direction in the figure). In the column direction (vertical direction in the figure), a plurality of data signal lines 52a, 52b, 52c and power source lines 53a, 53b, 53c are extended intersecting the gate signal lines. Areas surrounded by the two types of signal lines (51a, 51b, 51c, and 52a, 52b, 52c) overlapping one another constitute display pixel regions 110. Arranged in each display pixel region 110 are an EL display element 60, switching TFT 30, storage capacitor, and EL element driving TFT 40.

Along the direction in which the gate signal lines 51a, 51b, 51c extend (the row direction), a plurality of display pixels are arranged in a repetitive cycle of colors of red (R), green (G), and blue (B). The rows of display pixels connected to adjacent gate signal lines are arranged by shifting away relative to one another in the extending direction of the gate signal lines. This arrangement is the so-called delta arrangement.

For example, referring to the adjacent gate signal lines 51a and 51b, the row of display pixels connected to gate signal line 51a is arranged with respect to the row of display pixels connected to gate signal line 51b such that display pixels of the same color in the two rows are shifted away from one another in the extending direction of the gate signal lines by 1.7 pixels in the present embodiment. Similarly, concerning the adjacent gate signal lines 51b and 51c, the row of display pixels connected to gate signal line 51b is arranged with respect to the row of display pixels connected to gate signal line 51c such that the display pixels are shifted away from one another in the extending direction of the gate signal lines by 1.7 pixels.

Each data signal line 52a, 52b, 52c is extended generally in the column direction and connected to display pixels of the same color. Each data signal line is arranged along the column direction between display pixels by bending in each row and meandering to the left or right according to the arrangement of the display pixels in each row. Specifically, as the display pixels in adjacent rows are shifted by a predetermined pitch in the row direction, each data line 52a, 52b, 52c meanders in each row by the amount of the pixel shift while generally extending in the column direction. The meandering pitch, namely, the interval between the peaks of meander, of each data signal line 52a, 52b, 52c is approximately 0.4 display pixels in the present embodiment.

Each power source line 53a, 53b, 53c is arranged in the column direction and connected to display pixels of different colors.

Each power source line is arranged to alternately shift to the left or right of a connecting pixel by a predetermined number of display pixels according to the pixel arrangement in each row. Arrangement of power source line 53a is specifically described as an example. The power source line 53a is arranged on the right with respect to an R display pixel connected to the gate signal line 51a, and is connected to the EL element driving TFT of that display pixel. The power source line 53a passes along the right and bottom sides of the R display pixel. In the next row, the power source line 53a is arranged to the left with respect to a G display pixel which is connected to the gate signal line 51b and generally located in the same column as the above-mentioned R pixel (in the layout of FIG. 3, the G pixel is shifted from the R pixel by 0.4 pixels). The power source line 53a is connected to the EL element driving TFT of the G display pixel. Further, in the next row, the power source line 53a is arranged on the right with respect to an R display pixel which is connected to the gate signal line 51c and generally located in the same column as the above-mentioned R and G pixels. The power source line 53a is connected to the EL element driving TFT of the R display pixel. Between a power source line and a pixel located in a subsequent row, a gate signal line is disposed. Each power source line 53a, 53b, 53c intersects a gate signal line in each row. At the intersecting portion with the gate signal line, the power source line is arranged at a tilt angle of approximately 45° with respect to the gate signal line. The meandering pitch, namely, the interval between the peaks of meander, of a power signal line extending in the column direction is approximately 1.2 display pixels in the present embodiment. The data signal lines 52a, 52b, 52c and the power source lines 53a, 53b, 53c are both composed of a conductive material such as Al. Accordingly, these lines are arranged avoiding overlap so as to prevent short-circuiting one another.

Each gate signal line 51a, 51b, 51c includes protrusions formed corresponding to positions of display pixels. The protrusions constitute the gate electrodes. The extending direction of a gate electrode 11 is non-orthogonal with respect to the extending direction of a gate signal line. In other words, the gate electrode 11 is protruded in a direction tilted relative to the gate signal line. As used in this specification, the main extending direction of a gate electrode refers to the direction in which the longest portion of the gate electrode extends. For example, as in the case of FIG. 3, a gate electrode having a portion protruding downward from a gate signal line may include a protruding tip extending towards the lower right or lower left. The main extending direction for such a gate electrode is the lower right or lower left direction because the largest ratio of the length of the gate electrode extends in that direction. More specifically, in the case of FIG. 3, the main extending direction of a gate electrode is the lower right or lower left direction at an angle of approximately 45° with respect to the extending direction of the gate signal lines.

The switching TFT 30, EL element driving TFT 40, and EL display element 60 constituting a display pixel are next described by referring to the display pixel formed at the intersecting portion between the gate signal line 51a and the data signal line 52a as an example.

The switching TFT 30 comprises a gate electrode 11 connected to the gate signal line 51a and supplied with a gate signal. The gate electrode 11 has a protruding portion extending to the lower right direction. The switching TFT 30 further comprises an active layer 13 composed of a p-Si film, and a drain electrode 16. The drain electrode 16 is in contact with the drain region of the active layer 13. The drain electrode is also connected to the data signal line 52a and supplied with a data signal (drive signal) such as a video signal. The switching TFT 30 further includes a source electrode 13s (simultaneously served by the source region of the active layer 13) connected to the gate electrode 41 of the EL element driving TFT 40. The active layer 13 of the switching TFT 30 composed of p-Si film and the capacitor electrode 55 are formed at the same time as one integral structure on the substrate 10. The gate insulating film 12 is then deposited on top. Subsequently, the storage capacitor electrode line 54 and the gate electrode 11 are formed simultaneously using the same material.

The active layer 13 of the switching TFT 30 composed of p-Si film is arranged in the shape of letter "U" to intersect the gate electrode 11 twice. Channels 13c are provided in the respective intersecting portions, thereby forming the double gate structure.

The channel length direction of each channel 13c is oriented orthogonally with respect to the gate electrode 11 (the main extending direction of the gate electrode). Accordingly, the channel length direction is diagonally oriented relative to the gate signal line 51a at an angle of approximately 45°, similar to the orientation in the extending direction of the gate electrode 11.

According to this arrangement, during polycrystallization of an amorphous silicon film executed by laser irradiation to form the p-Si film of the active layer, even when the long-axis direction of the linear shape laser is identical to the extending direction of the gate signal line or is orthogonal to the extending direction of the gate signal line, the long-axis direction of the linear shape laser does not become parallel to the channel width direction. Accordingly, the a-Si film can be laser irradiated at a more uniform energy level-in the junction region between the channel and the source/drain. Specifically, as shown in FIG. 5A, the channel junction portion such as the area indicated by dotted circle A is prevented from being entirely overlapped by a peripheral low-energy portion of the linear shape laser. As a result, a p-Si film having uniform grain sizes can be obtained, preventing generation of leak current and accomplishing uniformity in the characteristics of the switching TFTs of the display pixels. Accordingly, voltage can be supplied to the gates of the driving TFTs 40 of the display pixels in a stable manner, realizing an EL display device achieving indication without irregularities.

As described above, the storage capacitor electrode line 54 is formed using the same material as the gate signal line 51a and arranged in parallel to the gate signal line 51a. A capacitor electrode 55 is joining the source 13s of the TFT 30, and charges are stored between the storage capacitor electrode line 54 and a capacitor electrode 55 formed beneath the gate insulating film 12, thereby creating a capacitor. This storage capacitor is provided for retaining the voltage applied to the gate electrode 41 of the EL element driving TFT 40.

The EL element driving TFT 40 includes a gate electrodes 41 connected to the source electrode 13s of the switching TFT 30, an active layer 43 composed of a p-Si film, a source electrode (source region of the active layer 43) 43s connected to the anode 61 of the EL element 60, and a drain electrode (drain region of the active layer 43) 43d connected to the power source line 53a supplying power to the EL element 60. The channel length direction of the EL element driving TFT 40 is oriented orthogonally with respect to the extending direction of the data signal line 52a and power source line 53a.

The EL element 60 comprises an anode 61a connected to the source electrode 43s, a cathode 67 which is a common electrode, and an emissive element layer 66 disposed between the anode 61 and the cathode 67. In each of the display pixels, an emissive layer material of red (R), green (G), or blue (B) is provided by a evaporation method. Each display pixel emits light of either R, G, or B according to the emissive layer material used in the pixel.

Within each pixel, the regions of the switching TFT, the storage capacitor, the element driving TFT, and the EL element are arranged in this order from the gate signal line side towards the bottom of the figure. With this arrangement, the distance between the emissive layer portions in the column direction can be enlarged, preventing an emissive layer material of a different color from penetrating and mixing in an adjacent emissive layer portion when evaporating the emissive layer of the EL elements for each color.

When a gate signal from the gate signal line 51a is applied to the gate electrode 11, the switching TFT 30 is turned on. In response, a data signal is supplied from the data signal line 52a to the gate electrode 41 of the EL element driving TFT 40. The potential of the gate electrode 41 thereby becomes equal to the potential of the data signal line 52a. As a result, a current corresponding to the value of the voltage supplied to the gate electrode 41 is supplied to the EL element 60 from the power source line 53b connected to a power source, causing light emission from the EL element 60.

The EL element 60 is formed by first providing the anode 61, which is made of a transparent electrode composed of a material such as ITO. The emissive element layer 66 is then superimposed. The emissive element layer 66 comprises a first hole-transport. layer 62 composed of MTDATA, a second hole-transport layer 63 composed of TPD, an emissive layer 64 composed of $Bebq_2$ including quinacridone derivatives, and an electron transport layer 65 composed of $Bebq_2$. Subsequently, the cathode 67 is formed by laminating LiF and Al, or by using an alloy of Al and lithium (Li).

All of the above-mentioned layers constituting the EL element 60 are laminated in the described order. Emission of different colors from the EL elements configured as described above can be achieved by using materials according to desired colors as the materials for the emissive layer 64 portions. Emission of colors R, G, and B can be accomplished with the layout as shown in FIG. 3 by forming the emissive layers 64 according to the following procedure, for example. After forming the first and the second hole transport layers 62, 63 on the entire surface over the anode and the planarizing film, a metal mask having openings corresponding to the positions for arranging a red emissive material is placed to perform deposition of the red emissive material. Subsequently, a metal mask having openings corresponding to the positions for arranging a green emissive material is placed to perform deposition. of the green emissive material and a metal mask having openings corresponding to the positions for arranging a blue emissive material is placed to perform deposition of the blue emissive material, thereby completing formation of the emissive layer 64 (for R, G, and B). During the above procedure, an emissive material of one color must be prevented from penetrating and mixing in an adjacent emissive layer of a different color.

A procedure for manufacturing the EL display device of the present invention is next described referring to FIGS. 4A–4C.

An a-Si film 3 is deposited on an insulating substrate 10 by a CVD method. Subsequently, the a-Si film 3 is irradiated with a linear shape laser such as an XeCl excimer laser having a wavelength of 308 nm. The linear shape laser is irradiated by scanning the substrate 10 from one end to the other in a scanning direction which matches the lengthwise direction of the substrate 10. Accordingly, during this process, the long-axis direction of the laser is oriented as shown in FIG. 5A with respect to the patterns of active layers 13 of TFTs 30 formed in a subsequent process. By melting and recrystallizing through this laser irradiation, the a-Si film is polycrystallized to form a p-Si film.

Using a photo-lithographic technique, the obtained p-Si film 3 is processed so that island patterns remain, forming the active layers 13, 43. At the same time, a capacitor electrode 55 serving as the first electrode of a storage capacitor is formed joining an active layer 13 of a switching TFT 30. Subsequently, a gate insulating film 12 made of an SiO$_2$ film is formed by a CVD method over the entire surface including the p-Si film in island patterns.

Over the gate insulating film 12, a film of a refractory metal such as Cr or Mo is deposited by a sputtering method. This film is then processed through a photo-lithographic technique to simultaneously form, using the same material, a gate signal line, a gate electrodell, and a storage capacitor electrode line 54, which are connected to a switching TFT 30. A storage capacitor electrode line 54 is a line connecting electrodes formed above the capacitor electrodes 55 in respective pixels to serve as the second electrodes of the storage capacitors. Further formed simultaneously is a gate electrode 41 of an EL element driving TFT 40. Within the same process, a connection between a gate electrode 41 and a source region 13s is created.

In positions within an active layer on both sides of a gate electrode 11, 41, impurities are introduced through the gate insulating film 12 by an ion doping to form a source region 13s, 43s and a drain region 13d, 43d. The source region 13s and the drain region 13d of a switching TFT 30 are doped with P ions to form an n-channel TFT. The source region 43s and the drain region 43d of an EL element driving TFT 40 are doped with B ions to form a p-channel TFT. Furthermore, in the switching TFT 30, regions having a lower impurity concentration compared to the source 13s and drain 13d regions, namely, LDDs (lightly doped drain) 13L, may be formed between the channel regions 13c directly underneath the gate electrode 11 and the source 13s and drain 13d regions.

A SiO$_2$ film, a SiN film, and a SiO$_2$ film are successively deposited by a CVD method over the gate signal lines 51, the gate electrodes 11, 41, and the storage capacitor electrode lines 54, forming an interlayer insulating film 15 composed of three layers.

Subsequently, a contact hole is created through the interlayer insulating film 15 and the underlying gate insulating film 12 in a position corresponding to a drain region 43d of an EL element driving TFT 40.

A conductive material such as Al is then formed within the contact hole and on the interlayer insulating film 15. The conductive material is processed through a photo-lithographic technique to form the data signal lines 52b and the power source lines 53b.

A planarizing insulating film 17 composed of a photo-sensitive acrylic resin or a SOG film, which possesses a planarizing property, is formed over the data signal lines 52b, power source lines 53b, and the interlayer insulating film 15. A contact hole is formed through the planarizing insulating film 17, the interlayer insulating film 15, and the gate insulating film 12 in a position corresponding to the source 43s of the EL element driving TFT 40. A transparent electrode made of an ITO film is formed through and above this contact hole to provide the anode 161 of the EL element 60.

Formed over the anode 61 is the emissive element layer 66 including a first hole transport layer 62, a second hole transport layer 63, an emissive layer, and an electron transport layer 64. Further on top, the cathode 67 is provided.

The TFTs 30, 40 and the EL element 60 created as described above are provided in each of the display regions 110 arranged in a matrix on a panel, thereby constituting an EL display device.

In an area above the gate signal line 51b, the data signal line 52a and the power source line 53a are arranged in parallel to one another along the main extending direction of a nearby gate electrode. With such an arrangement, the data signal line 52a and the power source line 53a can be arranged without short-circuiting one another, and wiring and display pixels can efficiently be arranged at a high density.

While the example of the preferred embodiment illustrates a case in which the gate electrodes protrude in a direction tilted at an angle of 45° with respect to the gate signal lines, the angle is not limited to 45° in the present invention. The angle may be any preferable angle, for example, 30°–60°, as long as the orientation of the junction portion between the channel and the source/drain region does not match the long-axis direction of the laser.

Although the meandering pitch (peak to peak along the column) of the data signal line (drive signal line) is 0.4 display pixels in the example of the preferred embodiment, the present invention is not limited to this configuration. The pitch can be of any width equal to or greater than 0.4 display pixels. Further, the meandering pitch of the power source line is not limited to 1.2 display pixels, and may be of any width equal to or greater than 1 display pixel, preferably approximately 1.5 display pixels. Furthermore, display pixels connected to adjacent gate signal lines are preferably shifted away from one another by 1.5 display pixels to accomplish the highest possible resolution.

When a pixel is described as "shifted by 1 display pixel" in the present specification, the pixel is shifted in the row direction by a pitch equivalent to one display pixel along the column direction.

While a polysilicon film is used as the active layer in the example for the preferred embodiment, a crystallite silicon film may be used instead to provide an active layer which is not completely crystallized.

An insulating substrate as referred to in the present specification is an insulating substrate made of a material such as glass or synthetic resin, or alternatively, a conductive or semiconductor substrate with a surface provided with insulating property by forming thereon an insulating film such as a $SiO_2$ or SiN film.

Although the preferred embodiment described a structure in which the anodes and the capacitor electrodes made of p-Si film do not overlap the data signal lines and the power source lines, the present invention is not limited to such a structure. Specifically, an anode may overlap a data signal line or a power source line with an insulating film disposed therebetween. According to such an arrangement, the size of light-emitting area can be enlarged, accomplishing a bright indication. Moreover, a capacitor electrode may overlap a power source line. With this arrangement, capacitance can be formed between the power source line and the capacitor electrode (with an interlayer insulating film disposed therebetween), in addition to the storage capacitor created between the storage capacitor electrode line and the capacitor electrode as in the above-described embodiment, thereby realizing a sufficiently large storage capacitor.

While the present embodiment illustrated an example in which the EL driving TFT has a single gate structure, the advantages of the present invention can similarly be achieved when a double gate structure is employed instead.

What is claimed is:

1. A thin film transistor, wherein
a main extending direction of a gate electrode configured by protruding from a gate signal line is tilted with respect to a direction non-orthogonal to an extending direction of said gate signal line.

2. The thin film transistor as defined in claim 1, wherein
a semiconductor film constituting an active layer intersects said gate electrode a plurality of times.

3. A display device, comprising:
a self-emissive element;
a switching thin film transistor (TFT) for supplying a current to said self-emissive element; and
a gate signal line for supplying a gate signal to said switching TFT; wherein
a main extending direction of a gate electrode protruding from said gate signal line is tilted with respect to an extending direction of said gate signal line.

4. The display device as defined in claim 3, wherein
an element driving TFT for supplying power to said self-emissive element is provided in a display pixel.

5. The display device as defined in claim 4, wherein
a data signal line for supplying a data signal to said switching TFT and a power source line for supplying power to said self-emissive element in accordance with said data signal are arranged intersecting said gate signal line in an area between display pixels.

6. The display device as defined in claim 5, wherein
a plurality of display pixels are arranged in a row direction in a plurality of rows;
respective display pixels in adjacent rows are shifted away from one another by a predetermined number of pixels;
said data signal line is meandered in accordance with the shift; and
the meandering direction and said main extending direction of said gate electrode substantially match.

7. The display device as defined in claim 4, further comprising:
a storage capacitor between said switching TFT and said element driving TFT, for retaining a data signal supplied through said switching TFT and supplying the data signal to said element driving TFT.

8. The display device as defined in claim 7, wherein
respective regions constituting said switching TFT, said storage capacitor, said element driving TFT, and said self-emissive element are arranged in each display pixel sequentially from a side of said display pixel adjacent to the gate signal line to which said display pixel is connected.

9. The display device as defined in claim 3, wherein
a data signal line for supplying a data signal to said switching TFT and a power source line for supplying power to said self-emissive element in accordance with said data signal are arranged intersecting said gate signal line in an area between display pixels.

10. The display device as defined in claim 9, wherein
said data signal line and said power source line do not intersect one another within a display region of said display device.

11. The display device as defined in claim 9, wherein
a channel length direction of an element driving TFT for supplying power to said self-emissive element is substantially orthogonal relative to said data signal line and/or said power source line.

12. The display device as defined in claim 3, wherein
a plurality of display pixels are arranged in a row direction in a plurality of rows;
respective display pixels in adjacent rows are shifted away from one another by a predetermined number of pixels;
a data signal line for supplying a data signal to said switching TFT is meandered in accordance with the shift; and
the meandering direction and said main extending direction of said gate electrode substantially match.

13. The display device as defined in claim 12, wherein
said data signal line and a power source line for supplying power to said self-emissive element do not intersect one another within a display region of said display device.

14. The display device as defined in claim 3, wherein
a semiconductor film constituting an active layer of said switching TFT intersects said gate electrode a plurality of times.

15. The display device as defined in claim. 3, wherein
said self-emissive element is an electroluminescence element.

16. The display device as defined in claim 3, wherein
said self-emissive element is an organic electroluminescence element.

17. The display device as defined in claim 3, wherein the extending direction of said gate signal line is parallel to an extending direction of one edge of the substrate on which said display device is formed.

18. The display device as defined in claim 3, wherein a channel length direction of said switching TFT is tilted relative to the extending direction of said gate signal line.

19. The display device as defined in claim 18, wherein the extending direction of said gate signal line is parallel to an extending direction of one edge of the substrate on which said display device is formed.

20. The display device as defined in claim 3, wherein a plurality of display pixels are arranged in a row direction in a plurality of rows;

respective display pixels in adjacent rows are shifted away from one another by a predetermined number of pixels;

a power source line for supplying a current to said self-emissive element is meandered in accordance with the shift of the display pixels; and the meandering direction and said main extending direction of said gate electrode substantially match.

* * * * *